United States Patent
Chen

(10) Patent No.: US 10,068,873 B2
(45) Date of Patent: Sep. 4, 2018

(54) METHOD AND APPARATUS FOR CONNECTING PACKAGES ONTO PRINTED CIRCUIT BOARDS

(71) Applicant: Taiwan Semiconductor Manufacturing Company, Ltd., Hsinchu (TW)

(72) Inventor: Hsien-Wei Chen, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/639,987

(22) Filed: Jun. 30, 2017

(65) Prior Publication Data

US 2017/0301645 A1    Oct. 19, 2017

Related U.S. Application Data

(60) Continuation of application No. 14/981,222, filed on Dec. 28, 2015, now Pat. No. 9,698,118, which is a
(Continued)

(51) Int. Cl.
*H01L 23/00* (2006.01)
*H01L 21/56* (2006.01)
*H01L 23/498* (2006.01)

(52) U.S. Cl.
CPC ............. *H01L 24/81* (2013.01); *H01L 21/56* (2013.01); *H01L 23/49811* (2013.01); *H01L 23/49894* (2013.01); *H01L 24/13* (2013.01); *H01L 24/16* (2013.01); *H01L 2224/023* (2013.01); *H01L 2224/03828* (2013.01);
(Continued)

(58) Field of Classification Search
CPC ....... H01L 24/01–24/33; H01L 21/56–21/568; H01L 24/81; H01L 24/80; H01L 24/82
See application file for complete search history.

(56) References Cited

U.S. PATENT DOCUMENTS

| | | |
|---|---|---|
| 6,335,571 B1 | 1/2002 | Capote et al. |
| 2001/0011764 A1 | 8/2001 | Elenius et al. |

(Continued)

FOREIGN PATENT DOCUMENTS

| | | |
|---|---|---|
| JP | 2004281491 | 10/2004 |
| KR | 1020010031276 | 1/2006 |
| KR | 1020070051165 | 5/2007 |

*Primary Examiner* — Thanhha Pham
(74) *Attorney, Agent, or Firm* — Slater Matsil, LLP

(57) ABSTRACT

Methods and apparatus are disclosed for attaching the integrated circuit (IC) packages to printed circuit boards (PCBs) to form smooth solder joints. A polymer flux may be provided in the process to mount an IC package to a PCB. The polymer flux may be provided on connectors of the IC package, or provided on PCB contact pad and/or pre-solder of the PCB. When the IC package is mounted onto the PCB, the polymer flux may cover a part of the connector, and may extend to cover a surface of the molding compound on the IC package. The polymer flux may completely cover the connector as well. The polymer flux delivers a fluxing component that facilitates smooth solder joint formation as well as a polymer component that offers added device protection by encapsulating individual connectors. The polymer component may be an epoxy.

20 Claims, 6 Drawing Sheets

Related U.S. Application Data division of application No. 13/788,015, filed on Mar. 7, 2013, now Pat. No. 9,224,678.

(52) U.S. Cl.
CPC ............... *H01L 2224/0401* (2013.01); *H01L 2224/05569* (2013.01); *H01L 2224/13* (2013.01); *H01L 2224/13024* (2013.01); *H01L 2224/13111* (2013.01); *H01L 2224/13113* (2013.01); *H01L 2224/13139* (2013.01); *H01L 2224/13144* (2013.01); *H01L 2224/13147* (2013.01); *H01L 2224/13155* (2013.01); *H01L 2224/16058* (2013.01); *H01L 2224/16112* (2013.01); *H01L 2224/16227* (2013.01); *H01L 2224/73104* (2013.01); *H01L 2224/814* (2013.01); *H01L 2224/81011* (2013.01); *H01L 2224/81024* (2013.01); *H01L 2224/8192* (2013.01); *H01L 2224/81191* (2013.01); *H01L 2224/81193* (2013.01); *H01L 2224/81815* (2013.01); *H01L 2224/83024* (2013.01); *H01L 2924/013* (2013.01); *H01L 2924/14* (2013.01); *H01L 2924/2064* (2013.01)

(56) References Cited

U.S. PATENT DOCUMENTS

| | | |
|---|---|---|
| 2002/0031868 A1 | 3/2002 | Capote et al. |
| 2004/0222522 A1 | 11/2004 | Homma |
| 2007/0170586 A1 | 7/2007 | Lee et al. |
| 2007/0259481 A1 | 11/2007 | Chung |
| 2009/0174069 A1 | 7/2009 | Nguyen et al. |
| 2013/0234317 A1* | 9/2013 | Chen ................. H01L 24/17 257/737 |
| 2013/0299966 A1 | 11/2013 | Kumar et al. |
| 2014/0252593 A1 | 9/2014 | Chen |

\* cited by examiner

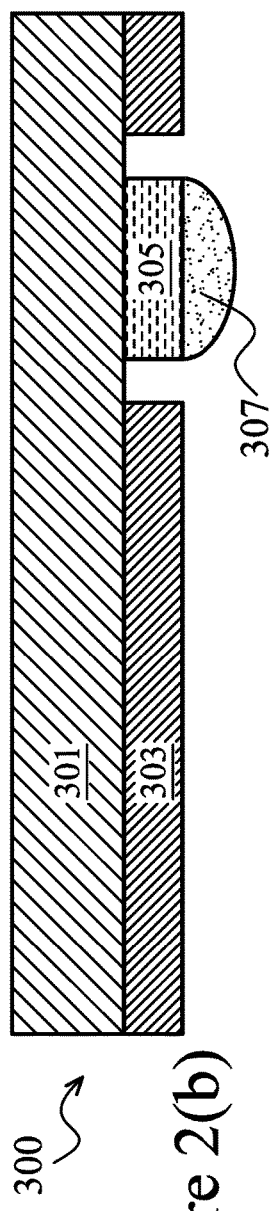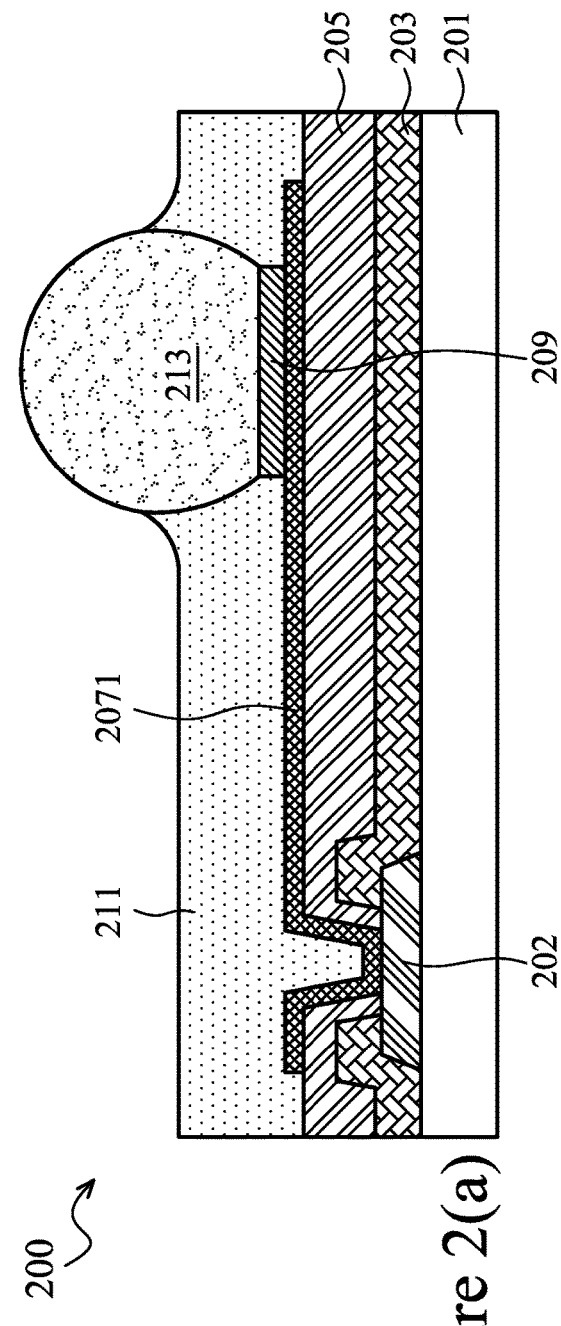
Figure 2(b)
Figure 2(a)

METHOD AND APPARATUS FOR CONNECTING PACKAGES ONTO PRINTED CIRCUIT BOARDS

PRIORITY CLAIM

This application claims the benefit to and is a continuation of U.S. patent application Ser. No. 14/981,222, filed on Dec. 28, 2015 and entitled "Method and Apparatus for Connecting Packages onto Printed Circuit Boards," which application claims the benefit to and is a divisional of U.S. patent application Ser. No. 13/788,015, now U.S. Pat. No. 9,224,678, filed on Mar. 7, 2013 and entitled "Method and Apparatus for Connecting Packages onto Printed Circuit Boards" which applications are incorporated herein by reference in their entirety.

BACKGROUND

An integrated circuit (IC) is an electronic circuit manufactured into the surface of a thin substrate of semiconductor material. ICs are used in virtually all electronic equipment today and have revolutionized the world of electronics. Computers, mobile phones, and other digital home appliances are now inextricable parts of the structure of modern societies, made possible by the low cost of producing ICs.

An IC is assembled into a package. The IC package protects the IC die from physical damage and redistributes the I/O to a more manageable pitch in assembly. An IC package also performs other functions such as providing a structure more amenable to standardization, providing a thermal path away from the die, providing protection from the potential of soft errors due to alpha particles, and providing a structure more easily disposed to electrical test and burn-in. Some current IC package technologies include quad flat pack (QFP), pin grid array (PGA), ball grid array (BGA), flip chips (FC), three dimensional integrated circuits (3DIC), chip scale packages, and package on package (PoP) devices.

A packaged device is then attached to a printed circuit board (PCB). A PCB is used as a base frame to mechanically support and electrically connect electronic components such as IC packages using conductive pathways, tracks or signal traces etched from copper sheets laminated onto a non-conductive substrate. Surface-mount technology (SMT) is a method for constructing electronic circuits in which an IC package is mounted directly onto the surface of PCBs. In SMT, components such as IC packages are placed on PCB contact pads and then electrically and mechanically coupled to the PCB with connectors such as solder balls.

There are a variety of techniques used to attach components such as IC packages to PCBs. However, current techniques of connecting the connectors and PCB contact pads or pre-solder may have some acute angles between connectors and PCB contact pads resulting in non-smooth joints, due to the notch stress concentration between the connectors and PCB contact pads. The acute angles may lead to ball crack points between the connectors and PCB contact pads connections. Molding compound alone may not be able to effectively reduce the crack points. Methods and apparatus are needed to attach IC packages to PCBs to form smooth solder joints.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2(a)-2(g) illustrate cross section views of embodiment methods and apparatus to attach a connector of an IC package to a PCB contact pad.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION

Figure 1:
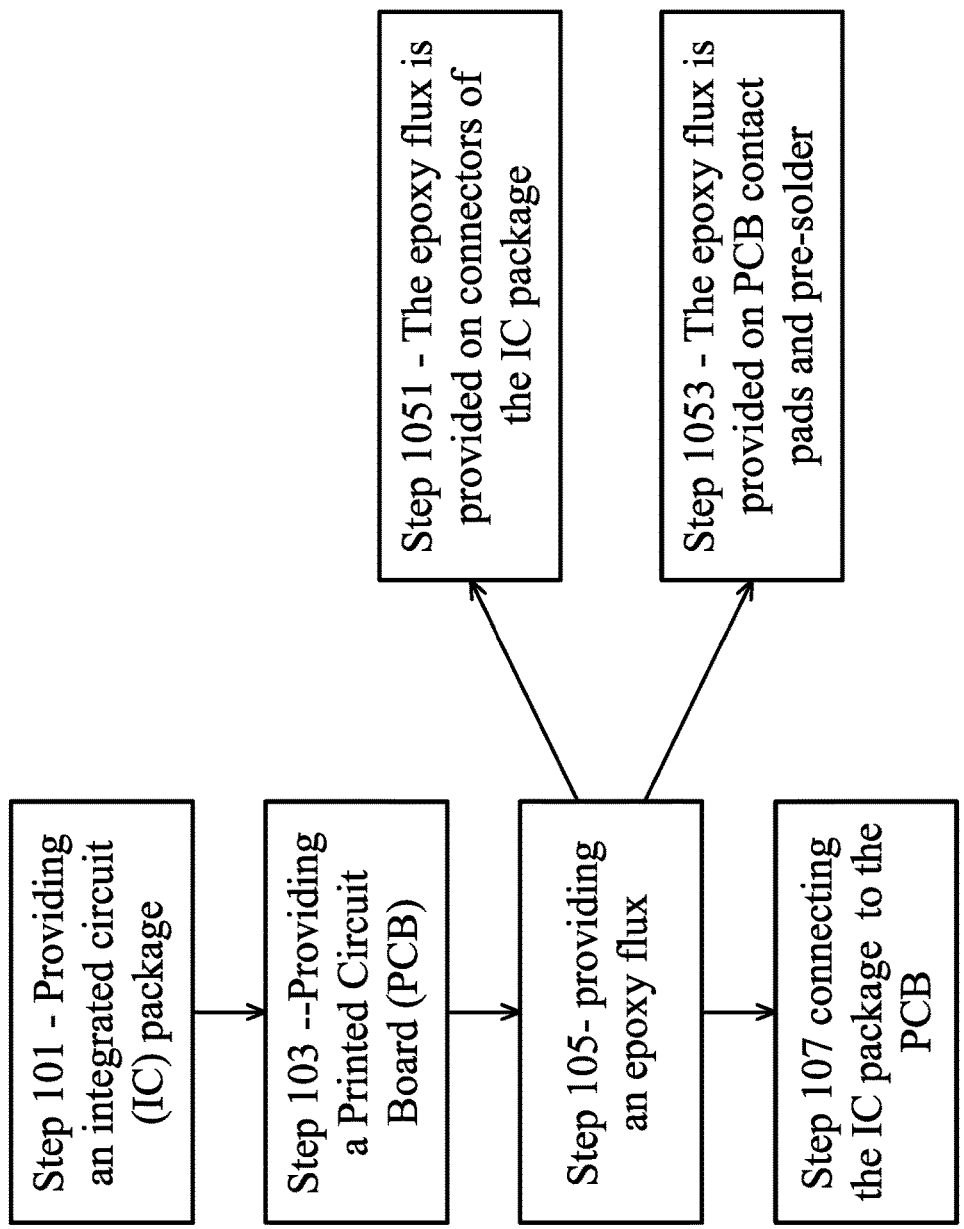
FIG. 1 illustrates a flow chart of embodiment methods to attach an IC package to a printed circuit board (PCB)

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

Methods and apparatus are disclosed for attaching IC packages to PCBs to form smooth solder joints. A polymer flux, such as an epoxy flux, may be provided in the process to mount an IC package to a PCB. The polymer flux may be provided on connectors of the IC package, or provided on PCB contact pads of the PCB. When the IC package is mounted onto the PCB, the polymer flux may cover a part of the connector, and may extend to cover a surface of a molding compound on the IC package. The polymer flux may completely cover the connector as well. The polymer flux delivers a fluxing component that facilitates smooth solder joint formation as well as a polymer component that offers added device protection by encapsulating individual connectors.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

A flow chart of embodiment methods to attach an IC package to a printed circuit board (PCB) is illustrated in FIG. 1. At step 101, an IC package is provided. At step 103, a PCB is provided. At step 105, a polymer flux is provided. The polymer flux may be an epoxy flux. There may be many ways to provide the polymer flux. One way shown in step 1051 is to provide the polymer flux on connectors such as solder balls of the IC package, while another way shown in step 1053 is to provide the polymer flux on the PCB contact pads and pre-solder. The pre-solder is optional. The polymer flux may be provided on the PCB contact pad without the pre-solder. At step 107, the PCB and the IC package may be connected together to form a connection between the connectors such as solder balls and the pre-solder on the PCB. The PCB and the IC package may be connected by a surface mount technology. The PCB and the IC package may be connected by mounting the connectors such as solder balls of the IC package to the PCB contact pads, with the polymer flux covering the connectors or the PCB contact pads, then reflowing the connectors of the IC package and the PCB contact pads of the PCB to make the connection. More details are described below using FIGS. 2(a)-2(g) as an illustration.

According to the flow chart in FIG. 1, an IC package may be provided in step 101. An IC package 200 with a connector such as a solder ball is shown in FIG. 2(a). There may be many more connectors on the IC package 200, which are not shown. The IC package 200 may be any kind of package such as a quad flat package (QFP), a pin grid array (PGA) package, a ball grid array (BGA) package, a flip chip (FC) package, a three dimensional integrated circuit (3DIC), a chip scale package, or a package on package (PoP) device.

Illustrated in FIG. 2(a), the IC package 200 comprises a substrate 201, a contact pad 202 on the substrate 201, which may be a part of an IC contained within the package 200. A passivation layer 203 covers the substrate 201 while exposing the contact pad 202. A polymer layer 205 may be formed on the passivation layer 203. One or a plurality of redistribution layer (RDL) 2071 may be formed on the polymer layer 205, in contact with the contact pad 202. An under bump metal (UBM) pad 209 may be formed on the RDL 2071. A connector such as a solder ball 213 may be placed on the UBM pad 209. A molding compound 211 may cover the RDL 2071, the polymer layer 205, and a part of the connector 213.

The IC package 200 may be a part of a base semiconductor wafer, which contains additional semiconductor IC not shown. The IC package 200 may further contain active and passive devices, conductive layers, and dielectric layers according to the electrical design of the circuit. The length of the IC package 200 is only for illustrative purposes and may not be drawn to scale.

The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The substrate 201 may comprise active devices such as transistors, shallow trench isolation (STI) regions, and other passive devices.

The contact pad 202 may be formed on the surface of the substrate 201 connected to metal contacts within the substrate or above the substrate, not shown. The contact pad 202 may be made with aluminum (Al), copper (Cu), or other electrically conductive material. The deposition of the contact pad 202 may use an electrolytic plating, sputtering, or electroless plating process. The size, shape, and location of the contact pad 202 are only for illustration purposes and are not limiting. The contact pad 202 may be formed to have a thickness of between about 0.5 μm and about 4 μm, such as about 1.45 μm.

The passivation layer 203 may be formed over the contact pad 202 and above the substrate 201 for structural support and physical isolation. The passivation layer 203 can be made with silicon nitride (SiN), silicon dioxide (SiO2), silicon oxynitride (SiON), or other insulating material. An opening of the passivation layer 203 may be made by removing a portion of the passivation layer 203 using a mask-defined photoresist etching process to expose the contact pad 202. The size, shape, and location of the opening made are only for illustration purposes and are not limiting. The passivation layer 203 may be formed through a process such as chemical vapor deposition (CVD), although any suitable process may be utilized, and may have a thickness between about 0.5 μm and about 5 μm, such as about 9.25 KÅ.

A polymer layer 205 may be formed over the passivation layer 203. The polymer layer 205 may be formed of a polymer material, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the polymer layer 205 may be between about 5 μm and about 30 μm, for example. An opening of the polymer layer 205 may be made by removing a portion of the polymer layer 205 using a mask-defined photoresist etching process to expose the contact pad 202.

A metal material is used to form a post passivation interconnect (PPI) lines or redistribution layer (RDL) 2071 on the polymer layer 205, following the contour of the polymer layer 205. The RDL 2071 may be made with, e.g., Ti, Al, Ni, nickel vanadium (NiV), Cu, or a Cu alloy. The formation methods include electrolytic plating, electroless plating, sputtering, chemical vapor deposition methods, and the like. The RDL 2071 can be made with a single layer, or multiple layers using an adhesion layer of Ti, TiW, or Cr, for example. The RDL 2071 may have a height between about 2 μm and about 10 μm for example. The height of the RDL 2071 is only shown for illustrative purposes and not limiting.

The UBM pad 209 may be formed in electrical contact with the RDL 2071. The UBM pad 209 may comprise a layer of conductive material, such as a layer of titanium, or a layer of nickel. The UBM pad 209 may comprise multiple sublayers, not shown. Any multiple layers made of materials such as titanium (Ti), tantalum (Ta), tantalum nitride (TaN), nickel (Ni), or copper (Cu), are suitable for the formation of the UBM pad 209. Any suitable materials or layers of material that may be used for the UBM pad 209 are fully intended to be included within the scope of the current embodiments. The UBM pad 209 may be created using processes such as sputtering, or evaporation, depending upon the desired materials. The UBM pad 209 may be formed to have a thickness of between about 0.01 μm and about 10 μm, such as about 5 μm.

A connector such as a solder ball or a bump 213 may be placed on the UBM pad 209. Solder bumps are widely used to form electrical interconnect in flip chip technology or other types of technologies for IC packaging. Various sizes of connectors such as solder balls or bumps are in use. A solder ball of a diameter size around 200 um to 500 um may be called a package bump and used to connect a device to a PCB. With the continuous reduction of feature sizes and package sizes, the sizes in embodiments may become smaller than the ones described above. Alternatively, connectors other than a solder ball may be placed above the UMB pad 209 to make electrical connections. In the current description, the phrase "solder ball" may be substituted by any other suitable connectors.

The connector 213 may be a solder ball comprising an electrically conductive solder material, e.g., Sn, Ni, Au, Ag, Cu, bismuthinite (Bi) and alloys thereof, or combinations of other electrically conductive material. For example, the connector 213 may be a Cu/SnAg solder ball. Alternatively, a copper bump instead of a solder ball may be used as the connector 213.

The molding compound 211 may cover the RDL 2071, the polymer layer 205, and a part of the connector 213. The molding compound 211 may be formed using a molding device. For example, the device 200 may be placed within a cavity of the molding device, and the cavity may be hermetically sealed. A molding compound 211 may be placed within the cavity either before the cavity is hermetically sealed or else may be injected into the cavity through an injection port. In an embodiment the molding compound 211 may be polyimide, polyphenylene sulfide (PPS), polyethersulfone (PES), polyetheretherketone (PEEK), a heat resistant crystal resin, combinations of these, or the like. Then the molding compound 211 may be cured in order to harden the molding compound 211 for optimum protection. The exact curing process is dependent at least in part on the particular material chosen for the molding compound 211. In an embodiment, the curing could occur through a process such as heating the molding compound 211 to between about 100° C. and about 130° C., such as about 125° C. for about 60 sec to about 3000 sec, such as about 600 sec. Additionally, initiators and/or catalysts may be included within the molding compound 211 to better control the curing process.

However, as one having ordinary skill in the art will recognize, the curing process described above is merely an exemplary process and is not meant to limit the current embodiments. Other curing processes, such as irradiation or even allowing the molding compound 211 to harden at ambient temperature, may alternatively be used. Any suitable curing process may be used, and all such processes are fully intended to be included within the scope of the embodiments discussed herein.

According to the flow chart in FIG. 1, a PCB may be provided in step 103. An example PCB segment 300 is shown in FIG. 2(*b*). The PCB 300 may be a motherboard, a communication board or a module substrate, as examples. The PCB 300 is used as a base frame to mechanically support and electrically connect electronic components such as IC packages using conductive pathways, tracks or signal traces etched from copper sheets laminated onto a non-conductive substrate. The PCB 300 comprises a PCB substrate 301. The PCB substrate 301 has a surface for surface mounting. Conducting layers within the PCB may be made of thin copper foil, while insulating layers dielectric are typically laminated together with epoxy resin.

A solder mask 303 is formed on the surface of the PCB substrate 301 to cover areas of the PCB substrate that should not be soldered. The solder mask 303 may be a polymer solder resist coating typically 20-30 micrometers thick. The solder mask 303 helps to prevent solder from bridging between conductors and creating short circuits. The solder mask 303 also provides some protection from the environment.

A plurality of PCB contact pads 305 is formed on the surface of the PCB substrate 301 (only one such pad 305 is shown). The solder mask 303 has a plurality of openings exposing the contact pads 305. The PCB contact pads 305 may be made with aluminum (Al), copper (Cu), tin (Sn), nickel (Ni), gold (Au), silver (Ag), or other electrically conductive material.

A plurality of pre-solders 307 are formed on the PCB contact pads 305. The pre-solder can be formed by screen-printing or stencil-printing. The pre-solder 307 can include materials, such as electroless nickel with immersion gold, electroless nickel-phosphorous with immersion gold, or electroless nickel with electroless palladium and immersion gold. The pre-solders 307 may be of a thickness in a range from 20 micrometers to about 30 micrometers. The pre-solders 307 are optional. The package may be formed without the pre-solders 307.

According to the flow chart in FIG. 1, a polymer flux is provided at step 105. The polymer flux may be an epoxy flux. There may be many ways to provide the polymer flux. One way shown in step 1051 of FIG. 1 is to provide the polymer flux 215 on connectors 213 of the IC package, as shown in FIG. 2(*c*). Another way shown in step 1053 of FIG. 1 is to provide the polymer flux 215 on the PCB contact pad 305 and pre-solder 307 as shown in FIG. 2(*d*). The polymer flux 215 combines a flux component with a polymer component. The polymer component may be an epoxy. The fluxing component facilitates solder joint formation, while the polymer component offers added device protection by encapsulating individual connector 213. The fluxing component does not exist at the final stage. The polymer flux 215 also provides deposition flexibility and, depending on the application and process, can be screen printed, dipped, jetted, or dispensed as required. The polymer flux 215 only encapsulates individual connectors 213, leaving channels underneath the device that allow volatile gasses from the substrate to escape, while still providing solder joint protection.

According to the flow chart in FIG. 1, at step 107, the PCB and the IC package may be connected together to form a connection between the connectors and the pre-solder on the PCB. The PCB and the IC package may be connected by a surface mount technology. The PCB 300 and the IC package 200 may be connected by mounting the connectors such as solder balls 213 of the IC package 200 to the PCB contact pads 305 with pre-solder 307, with the polymer flux 215 between the solder balls 213 and the pre-solder 307. The device is then reflowed so that the connectors 213 of the IC package 200 and the pre-solder 307 of the PCB 300 are connected. During the reflow of the device, the PCB 300 with IC package 200 attached may enter an oven and is gradually introduced to temperatures that cause the solder ball and the pre-solder to become liquidous. Once the solder ball and the pre-solder is liquidous, the solder ball and the pre-solder make an electrical contact with the PCB contact pads 305.

Figure 2D:
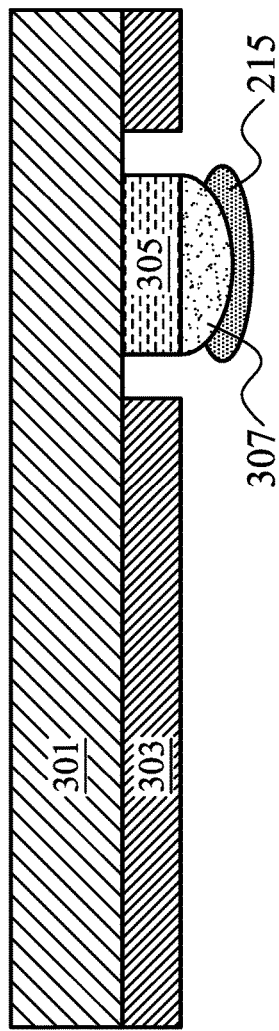
Figure 2C:
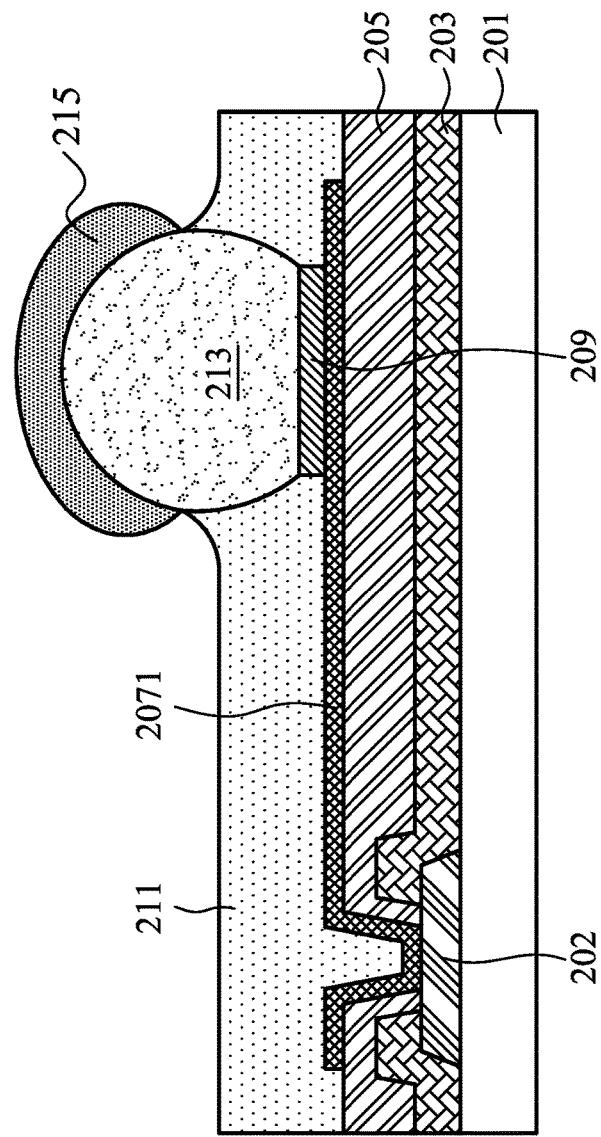
Figure 2E:
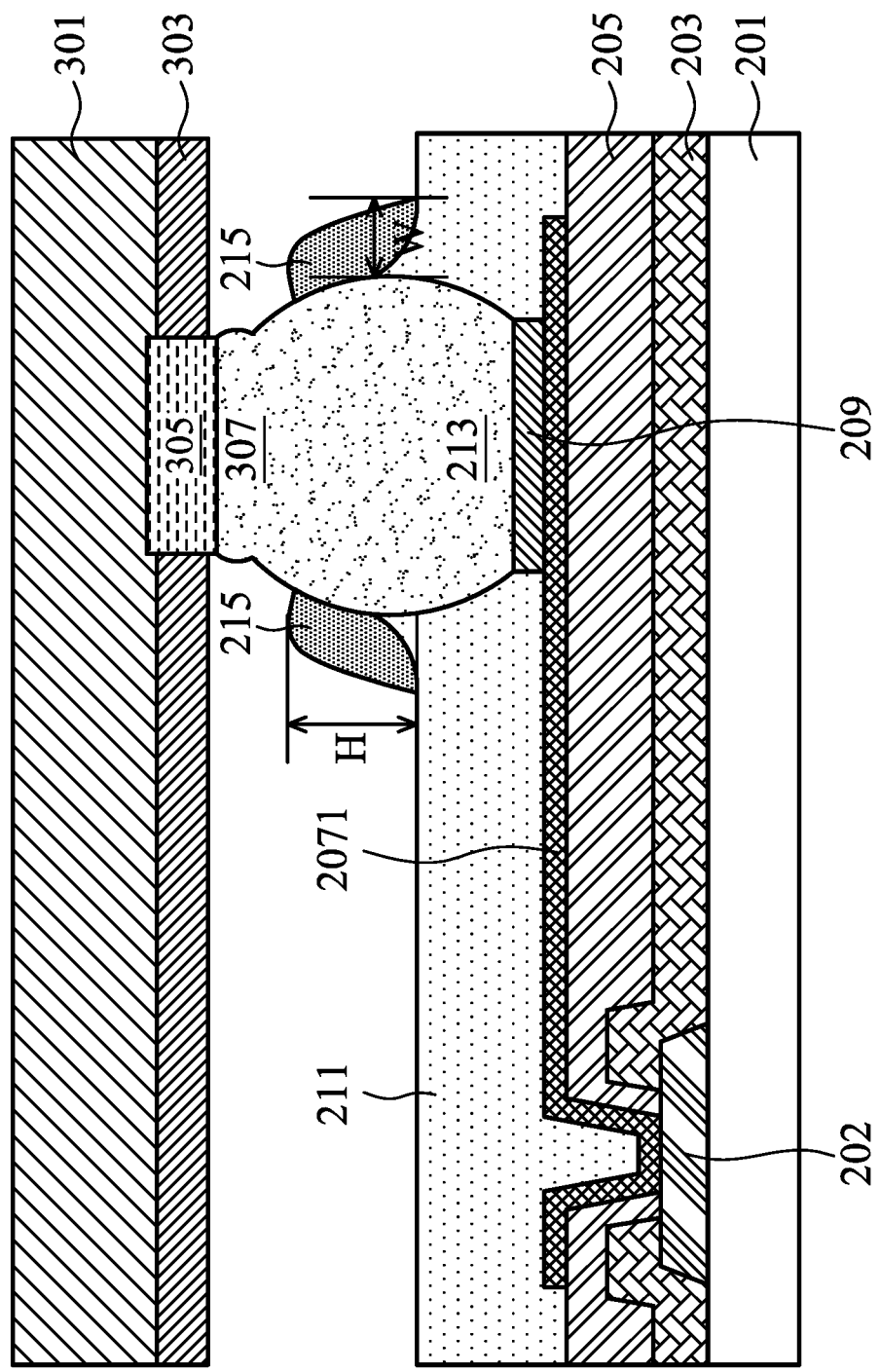
Figure 2F:
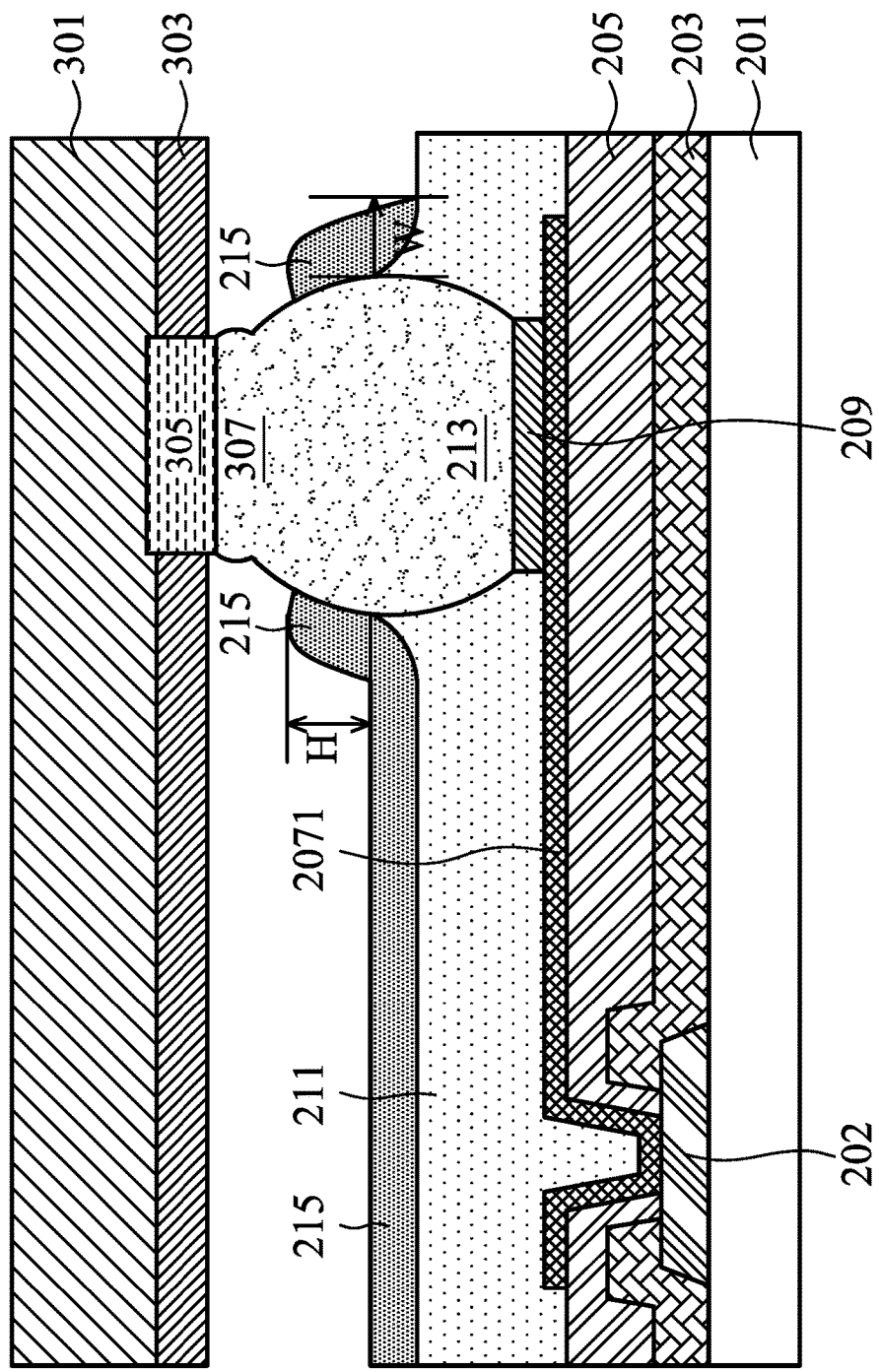
Figure 2G:
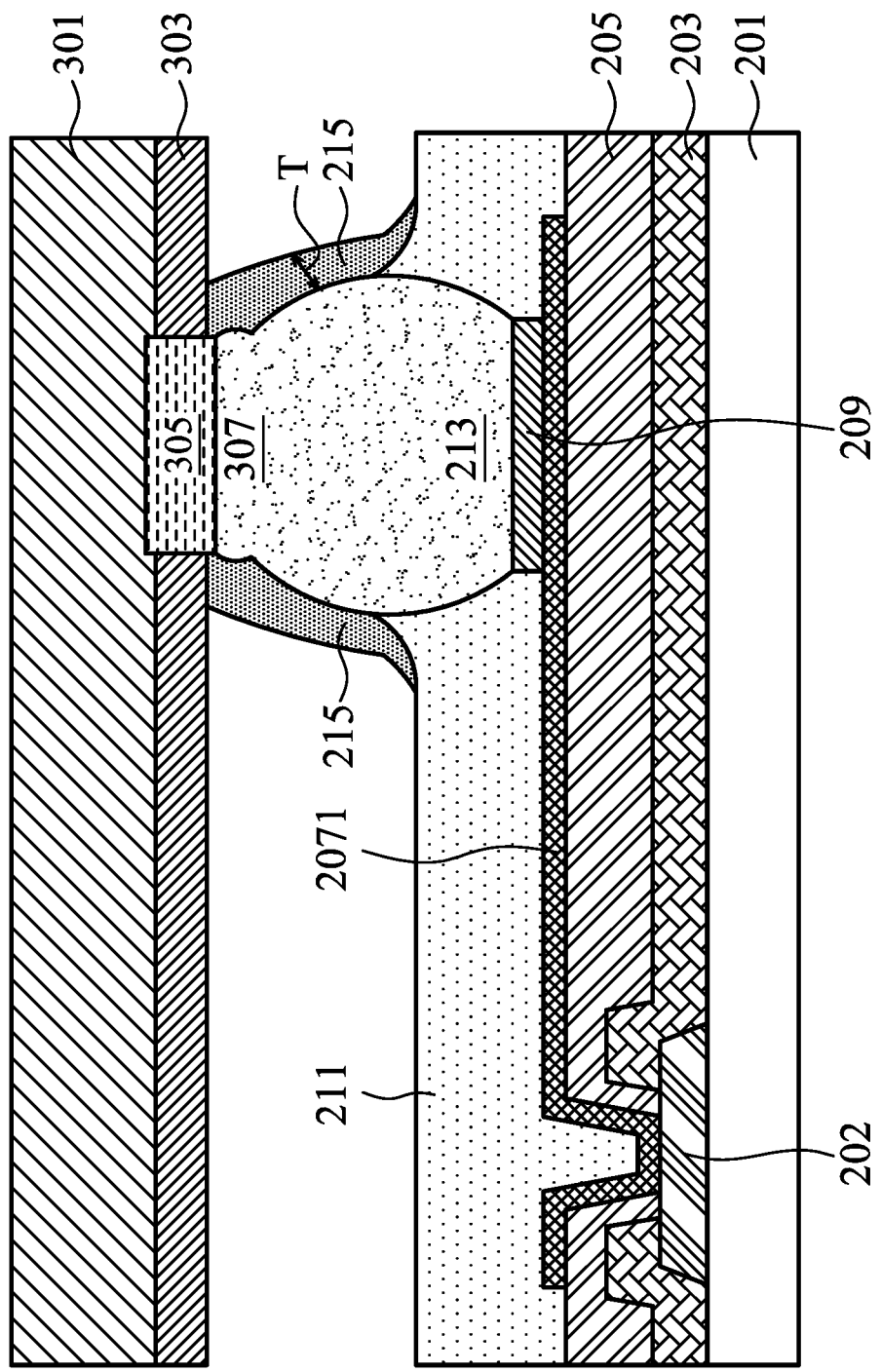

The results of the step 107 after mounting the IC package on the PCB are shown in FIGS. 2(e)-2(g). When the polymer flux 215 is provided on the connector 213 as shown in FIG. 2(c), after the IC package 200 is mounted to the PCB 300, the polymer flux 215 may cover a part of the connector 213, as shown in FIG. 2(e). As illustrated in FIG. 2(e), the polymer flux 215 may have a width W from about 15 um to about 30 um surrounding the connector 213. The height H of the polymer flux 215 may be in a range from about 5 um to about 50 um. Additionally, the polymer flux 215 may cover a part of the surface of the molding compound 211, to a height from about 1 um to about 3 um, as shown in FIG. 2(f).

Alternatively, when the polymer flux 215 is provided on the pre-solder 371 of the PCB as shown in FIG. 2(d), after the IC package 200 is mounted to the PCB 300, the polymer flux 215 may cover the entire connector 213, as shown in FIG. 2(g). The thickness of the polymer flux 215 may be in a range from about 5 um to about 20 um.

In at least one aspect, embodiments described herein provide for a method of forming a device, comprising providing an integrated circuit (IC) package comprising a connector and an IC, and a molding compound, the molding compound encapsulating a portion of the connector, wherein a portion of the connector protrudes above a topmost surface of the molding compound. The method further includes providing a printed circuit board (PCB) comprising a PCB contact pad, and selectively applying a polymer flux to the portion of the PCB contact pad. After selectively applying the polymer flux, the method includes bringing the IC package into contact with the PCB and forming a connection between the PCB contact pad and the connector, wherein the polymer flux covers at least a part of the connector and extends over the topmost surface of the molding compound after the IC package and the PCB are brought into contact.

In least another aspect, embodiments described herein provide for a method of forming a device, comprising providing an integrated circuit (IC) package comprising a connector and an IC, and providing a printed circuit board (PCB) comprising a PCB contact pad. The method further includes forming a molding compound over the connector, wherein the molding compound encapsulates a portion of the connector and has a topmost surface from which a second portion of the connector protrudes, and providing a polymer flux on the PCB contact pad. The method yet further includes connecting the PCB contact pad and the connector with the polymer flux between the connector and the PCB contact pad, and reflowing the device to make a connection between the connector and the PCB contact pad, wherein the polymer flux covers at least a part of the connector, and wherein the polymer flux flows over a portion of the topmost surface of the molding compound.

In yet other aspects, embodiments described herein provide for a method of forming a device, comprising providing a first component having a first connection element formed thereon, and forming a molding compound over the first component. The method further includes providing a second component having a PCB contact pad formed thereon, and after forming the molding compound, applying a polymer flux to the PCB contact pad and the first component, the polymer flux including a fluxing component and a polymer component. The method continues with aligning and contacting the first connection element to the second connection element, and reflowing the first connection element and the second connection element to form a bond therebetween, wherein the polymer component of the polymer flux covers at least a part of the first connection element after the step of reflowing.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A device comprising:
a first substrate having a conductive line;
a first contact pad over the conductive line;
a second substrate bonded to the first substrate, the second substrate comprising a second contact pad;
a conductive connector physically and electrically coupling the first contact pad and the second contact pad;
a molding compound encapsulating a first portion of the conductive connector, the molding compound extending along sidewalls of the conductive line; and
a polymer material encapsulating a second portion of the conductive connector, the first portion of the conductive connector being interposed between the first contact pad and the second portion of the conductive connector, at least a portion of a first surface of the second substrate being free of the polymer material, the first surface of the second substrate facing the molding compound.

2. The device of claim 1, wherein the polymer material extends completely over the molding compound.

3. The device of claim 1, wherein at least a portion of an upper surface of the molding compound being free of the polymer material.

4. The device of claim 1, wherein the polymer material completely encapsulates the conductive connector between the molding compound and the second substrate.

5. The device of claim 1, wherein the polymer material extends a first distance above an outermost surface of the molding compound and extends a second distance laterally across the outermost surface of the molding compound, the second distance being greater than the first distance.

6. The device of claim 1, wherein the polymer material has of a width from about 5 um to about 30 um and a height about from about 5 um to about 50 um.

7. The device of claim 1, wherein a cross-section of the conductive connector has a plurality of concave sections facing each lateral direction.

8. A device comprising:
   a first substrate having a conductive line;
   a conductive connector over the conductive line;
   a second substrate bonded to the first substrate, the second substrate comprising a contact pad, the contact pad being coupled to the conductive connector;
   a molding compound encapsulating a first portion of the conductive connector, the molding compound contacting the conductive line; and
   a polymer material extending along sidewalls of a second portion of the conductive connector, at least a portion of a first surface of the second substrate being spaced apart from the polymer material, the first surface of the second substrate facing the molding compound.

9. The device of claim 8, wherein the polymer material contacts the second substrate.

10. The device of claim 8, wherein sidewalls of a third portion of the conductive connector are free of the polymer material, the third portion being interposed between the second portion and the second substrate.

11. The device of claim 8, wherein an uppermost surface of the molding compound is covered with the polymer material.

12. The device of claim 11, wherein a thickness of the polymer material at a location spaced apart from the conductive connector is between about 1 um and about 3 um.

13. The device of claim 8, wherein the polymer material has of a width from about 5 um to about 30 um and a height about from about 5 um to about 50 um.

14. A device comprising:
    a package, the package comprising:
      a first substrate having a conductive line;
      a first contact pad on the conductive line;
      a conductive connector physically and electrically coupled to the first contact pad; and
      a molding compound encapsulating a first portion of the conductive connector, a second portion of the conductive connector protruding above a topmost surface of the molding compound, the molding compound contacting the conductive line;
    a printed circuit board (PCB) bonded to the package, the PCB comprising a second contact pad, the second contact pad being physically and electrically coupled to the second portion of the conductive connector; and
    a polymer material extending along a sidewall of the second portion of the conductive connector, a portion of a first surface of the PCB not being in physical contact with the polymer material, the portion of the first surface of the PCB facing the first substrate.

15. The device of claim 14, wherein at least a section of the second portion of the conductive connector being free of the polymer material.

16. The device of claim 14, wherein a sidewall of the second portion of the conductive connector comprises a plurality of convex sidewalls.

17. The device of claim 16, wherein the polymer material extends along only one of the plurality of convex sidewalls.

18. The device of claim 16, wherein the polymer material extends from the molding compound to the second contact pad.

19. The device of claim 14, wherein the polymer material covers a planar section of the molding compound.

20. The device of claim 19, wherein a thickness of the polymer material over the planar section of the molding compound is between about 1 um and about 3 um.

* * * * *